US006336208B1

United States Patent
Mohan et al.

(10) Patent No.: US 6,336,208 B1
(45) Date of Patent: Jan. 1, 2002

(54) DELAY OPTIMIZED MAPPING FOR PROGRAMMABLE GATE ARRAYS WITH MULTIPLE SIZED LOOKUP TABLES

(75) Inventors: Sundararajarao Mohan, Cupertino; Kamal Chaudhary, San Jose, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/244,662

(22) Filed: Feb. 4, 1999

(51) Int. Cl.[7] .............................................. G06F 17/50
(52) U.S. Cl. ................................ 716/16; 716/2; 716/3; 716/17; 326/37; 326/38; 326/39; 326/41; 326/47
(58) Field of Search ........................... 716/16, 2, 3, 17; 326/41, 37–39, 47

(56) References Cited

U.S. PATENT DOCUMENTS

| | | | | |
|---|---|---|---|---|
| 5,537,341 A | * | 7/1996 | Rose et al. | 716/16 |
| 5,610,829 A | * | 3/1997 | Trimberger | 716/16 |
| 6,118,300 A | * | 9/2000 | Wittig et al. | 326/41 |

OTHER PUBLICATIONS

Korupolu, M.R. et al., "Exact tree–based FPGA technology mapping for logic blocks with independent LUTs"; Design Automation Conference, 1998, pp. 708–711.*

Chen, K.–C., et al., "DAG–Map: graph–based FPGA technology mapping for delay optimization"; IEEE Design & Test of Computers; vol. 9 3, 1992, pp. 7–20.*

Schlag, M., et al., "Empirical evaluation of multilevel logic minimization tools for a lookup–table–based field–programmable gate array technology"; IEEE Trans. on CAD of Int. Circ.; 1993; pp. 713–722.*

Farrahi, A.H., "Complexity of the lookup–table minimization problem for FPGA technology mapping"; IEEE Trans. on CAD of ICs and Systems; vol. 13 11; 1994; pp. 1319–1332.*

Cong, J., et al., "An improved graph–based FPGA technology mapping algorithm for delay optimization"; IEEE 1992 International Conference on Computer Design; 1992; pp. 154–158.*

Robert Francis, Jonathan Rose, and Zvonko Vranesic; "Chortle–crf: Fast Technology Mapping for Lookup Table–Based FPGAs"; Proceedings of the Design Automation Conference 1991; pp 227–233.

J. Cong and Y. Ding; "FlowMap: An Optimal Technology Mapping Algorithm for Delay Optimization in Lookup–Table Based FPGA Designs"; IEEE Transactions on CAD, Feb. 1994, vol. 13, No. 1, pp 1–12.

Jianshe He and Jonathan Rose, "Technology Mapping for Heterogeneous FPGAs", 1994 ACM International Conference on FPGAs.

Jason Cong and Songjie Xu, "Delay–Optimal Technology Mapping for FPGAs with Heterogeneous LUTs", 1998 Design Automation Conference.

* cited by examiner

*Primary Examiner*—Mattew Smith
*Assistant Examiner*—Jibreel Speight
(74) *Attorney, Agent, or Firm*—LeRoy D. Maunu, Esq.; Edel M. Young

(57) ABSTRACT

A process for mapping logic nodes to a plurality of sizes of lookup tables in a programmable gate array. A node and its predecessor nodes are selectively collapsed into a first single node as a function of delay factors associated with the plurality of sizes of lookup tables and a maximum of delay factors associated with the predecessor nodes. If a cut-size associated with the first single node is less than or equal to one of the sizes of lookup tables, the one size is selected to implement the first single node. If a lookup table size was not selected for the first single node, the node and its predecessor nodes are selectively collapsed into a second single node as a function of the delay factors and the maximum delay factor increased by a selected value. If a cut-size associated with the second single nodes is less than or equal to one of the sizes of lookup tables, the one size is selected to implement the second single node.

19 Claims, 10 Drawing Sheets

DELAY OPTIMIZED MAPPING FOR PROGRAMMABLE GATE ARRAYS WITH MULTIPLE SIZED LOOKUP TABLES

FIELD OF THE INVENTION

The present invention generally relates to mapping combinational logic to circuit elements of a programmable logic device, and more particularly, mapping combinational logic to lookup tables (LUTs) of multiple sizes.

BACKGROUND

Field programmable gate arrays (FPGAs), first introduced by XILINX in 1985, are becoming increasingly popular devices for use in electronics systems. For example, communications systems employ FPGAs in large measure for their re-programmability. In general, the use of FPGAs continues to grow at a rapid rate because FPGAs permit relatively short design cycles, reduce costs through logic consolidation, and offer flexibility in their re-programmability. The capabilities of and specifications for XILINX FPGAs are set forth in "The Programmable Logic Data Book," published in 1998 by XILINX, Inc., the contents of which is incorporated herein by reference.

Some types of FPGAs are implemented with a network of programmable logic blocks that include lookup tables (LUTs). A LUT is used to implement a user-programmed logic function of the LUT inputs, and the number of inputs for a particular LUT depends upon the FPGA architecture.

Mapping software converts a user's combinational logic circuit into a network of LUTs for an FPGA implementation. Examples of such mapping software include Chortle-crf and FlowMap. The Chortle software is described in "Chortle-crf: Fast Technology Mapping for Lookup Table-Based FPGAs" by Robert Francis, Jonathan Rose, and Zvonko Vranesic, proceedings of the Design Automation Conference 1991, pp 227–223. The FlowMap software is described in "FlowMap: An Optimal Technology Mapping Algorithm for Delay Optimization in Lookup-Table Based FPGA Designs" by J. Cong and Y. Ding, IEEE Transactions on CAD, February 1994, vol. 13, No. 1, pp 1–12. Mapping software typically attempts to optimize area, delay, or a combination of area and delay. Area is modeled as the total number of LUTs required for the mapping, and delay is typically modeled in terms of the number of levels of logic in the critical path from an input of the circuit to an output of the circuit that is determined to be the critical path. Chortle-crf attempts to produce a mapping having an optimized delay and area, and FlowMap attempts to produce a mapping having an optimized delay.

The latest FPGAs have lookup tables of multiple sizes. Researchers have described algorithms for mapping to LUTs of multiple sizes while minimizing the delay. One such algorithm is described in a paper by Jianshe He and Jonathan Rose entitled "Technology Mapping for Heterogeneous FPGAs" (1994 ACM International Conference on FPGAs). Another mapping software package described by Jason Cong and Songjie Xu for mapping a network to multiple sizes of LUTs entitled "Delay-Optimal Technology Mapping for FPGAs with Heterogeneous LUTs," presented at the 1998 Design Automation Conference improves upon the process by He and Rose. The process by He and Rose can take an indefinite amount of time. Cong and Xu state that their process can be performed in an amount of time proportional to $$\left(\sum_{i=1}^{c} K_i * n * m * \log_2 n\right)$$

where c is the number of LUT sizes, $K_i$ is the number of LUT inputs for $LUT_i$, n is the number of nodes, and m is the number of edges, and is thus an improvement over He and Rose. While the present mapping solutions appear to achieve the objective of mapping a network to multiple size LUTs, the computational complexity may prove to be a hindrance as FPGAs are used to implement increasingly larger networks.

A method that address the aforementioned problems, as well as other related problems, is therefore desirable.

SUMMARY OF THE INVENTION

In various embodiments, the invention comprises processes for mapping logic nodes to a plurality of sizes of lookup tables in a programmable gate array.

In one embodiment, a node and its predecessor nodes are selectively collapsed into a first single node as a function of delay factors associated with the plurality of sizes of lookup tables and a maximum of delay factors associated with the predecessor nodes. The term "collapse" is used here to mean that a plurality of original nodes and their input and output signals (where the output signal of one original node is an input signal to another original node) are replaced by a single node plus all the input signals and output signals except those that connect the original nodes. If a cut-size (number of inputs) associated with the first single node is less than or equal to the number of inputs to one of the sizes of lookup tables, the one size is selected to implement the first single node. If a lookup table size was not matched by the first single node, the node and its predecessor nodes are selectively collapsed into a second single node as a function of the delay factors, and the maximum delay factor is increased by a selected value. If a cut-size associated with the second single nodes is less than or equal to the number of inputs to one of the sizes of lookup tables, the one size is selected to implement the second single node.

In another embodiment, each of the plurality of sizes of lookup tables has an associated delay factor. The process comprises:

(a) initializing a counter to a selected value;

(b) selecting one of the sizes of lookup tables;

(c) collapsing into a single node the logic node and those of the predecessor logic nodes having delay factors greater than a maximum of delay factors associated with the predecessor logic nodes plus the counter value minus the delay factor of the one size lookup table;

(d) if the single node has an associated cut-size that is less than or equal to the number of inputs to the one size lookup table, mapping to the one size lookup table the logic nodes that have been collapsed into the single node and that are within a cut of the single node;

(e) if the associated cut-size of the single node is greater than the one size lookup table, selecting another one of the sizes of lookup tables to use as the one size;

(f) repeating steps c through e until the logic node is mapped or all the sizes of lookup tables have been considered in mapping;

(g) if the logic node has not been mapped to one of the sizes of lookup tables and all the sizes of lookup tables have been considered in mapping, incrementing the counter; and (h) repeating steps b through g until the counter value equals a least of delay factors of the sizes of lookup tables.

In yet another embodiment, a process for mapping a logic node and its predecessor logic nodes to one of a plurality of sizes of lookup tables in a programmable gate array comprises:

(a) initializing a collapse factor as a function of a maximum of respective delay factors associated with the predecessor logic nodes, wherein the collapse factor is greater than the maximum of the delay factors of the predecessor logic nodes;

(b) selecting one of the sizes of lookup tables;

(c) collapsing into a single node the logic node and the ones of the predecessor logic nodes having delay factors greater than the collapse factor minus the delay factor of the one size lookup table;

(d) if the single node has an associated cut-size that is less than or equal to the number of inputs to the one size lookup table, mapping to the one size lookup table the logic nodes collapsed into the single node that are within a cut of the single node;

(e) if the associated cut-size of the single node is greater than the one size lookup table, selecting another one of the sizes of lookup tables to use as the one size;

(f) repeating steps c through e until the logic node is mapped or all the sizes of lookup tables have been considered in mapping.

In another embodiment, a process for mapping comprises:

(a) arranging the nodes to be processed in topological order such that all fan-ins for a node are processed before the node is processed;

(b) getting the next node to be processed;

(c) selecting the smallest size LUT, along with its LUT delay and cut size;

(d) collapsing into a single node the node in process and all predecessor nodes having a delay greater than the maximum delay of the predecessor nodes minus the LUT delay of the selected LUT (so that collapsing reduces delay);

(e) if the network formed by collapsing these nodes has a cut size less than or equal to the number of inputs of the selected LUT, mapping the collapsed node into the LUT and assigning the LUT delay to the collapsed node;

(f) if the cut sizes don't match and there are more LUT sizes available, selecting a larger LUT size (with new LUT delay and cut size);

(g) repeating steps d, e, and f until all LUT sizes have been tried or the node is mapped;

(h) if mapping did not occur for any of the LUT sizes when all those predecessor nodes having delay greater than MAXDELAY minus LUTxDELAY were collapsed into a single node, then increase delay by a factor i and repeat steps c through g until the factor i is equal to delay of the fastest LUT;

(i) selecting the fastest LUT and assigning the node to the selected LUT; and (j) repeating the process for all nodes.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings in which.

Figure 1:
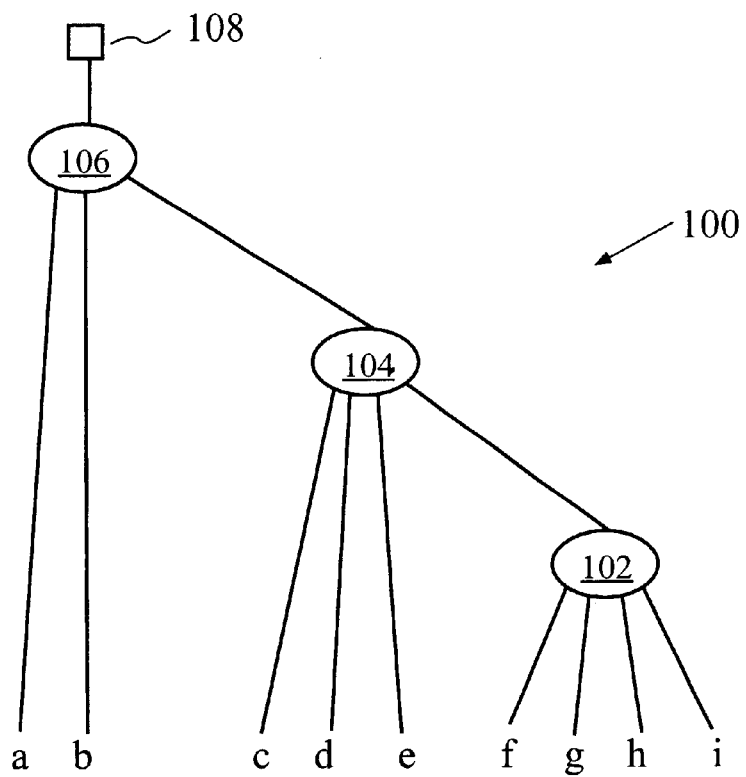
FIG. 1 is a graph of an example network of nodes prior to mapping to LUTs of a programmable gate array.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of programmable gate arrays having LUTs of various sizes and delays. For example, the present invention has been found to be particularly applicable and beneficial for programmable gate arrays having 4-input and 8-input LUTs. While the present invention is not so limited, an appreciation of the present invention is presented by way of specific examples, in this instance a programmable gate array having 4-input and 8-input LUTs. A LUT having 4 inputs will be referred to as a "4-LUT," a LUT having 8 inputs will be referred to as an "8-LUT," and a LUT having x inputs will be referred to as an "x-LUT."

FIG. 1 is a graph of an example network 100 of nodes prior to mapping to LUTs of a programmable gate array. The example graph includes inputs a, b, c, d, e, f, g, h, and i. Node 102 implements a function of the inputs f, g, h, and i.

Node 104 implements a function of the inputs c, d, e, and the output of node 102, and node 106 implements a function of the inputs a, b, and the output of node 104. Output 108 is the output of the network 100.

While not shown, it will be appreciated that the inputs a, b, c, d, e, f, g, h, and i and the output 108 may be coupled to additional networks of combinational logic. However, in this example, and in the others that follow, the inputs are assumed to be primary inputs and only a small number of nodes are included in order to aid in understanding while not obscuring the invention. Some designs include loops so that it is not possible to process nodes only after all their fan-ins are processed. In this case, a well-known pre-processing step should be performed to detect and break any loops. The description here assumes that the network contains no loops. Also, the fan-in of each node is assumed to be less than or equal to the fan-in of the smallest LUT. (The step of reducing fan-in is described in the FlowMap paper mentioned above.)

Figure 2:
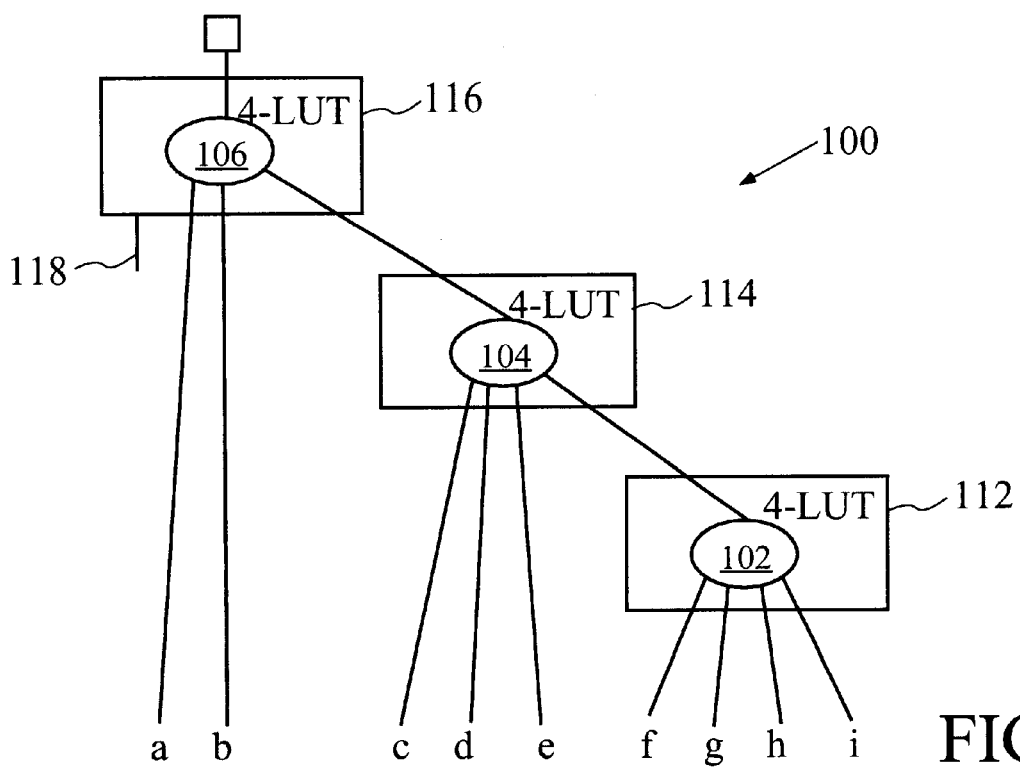
FIG. 2 is a graph of a network after mapping the nodes to respective 4-LUTs.
Figure 3:
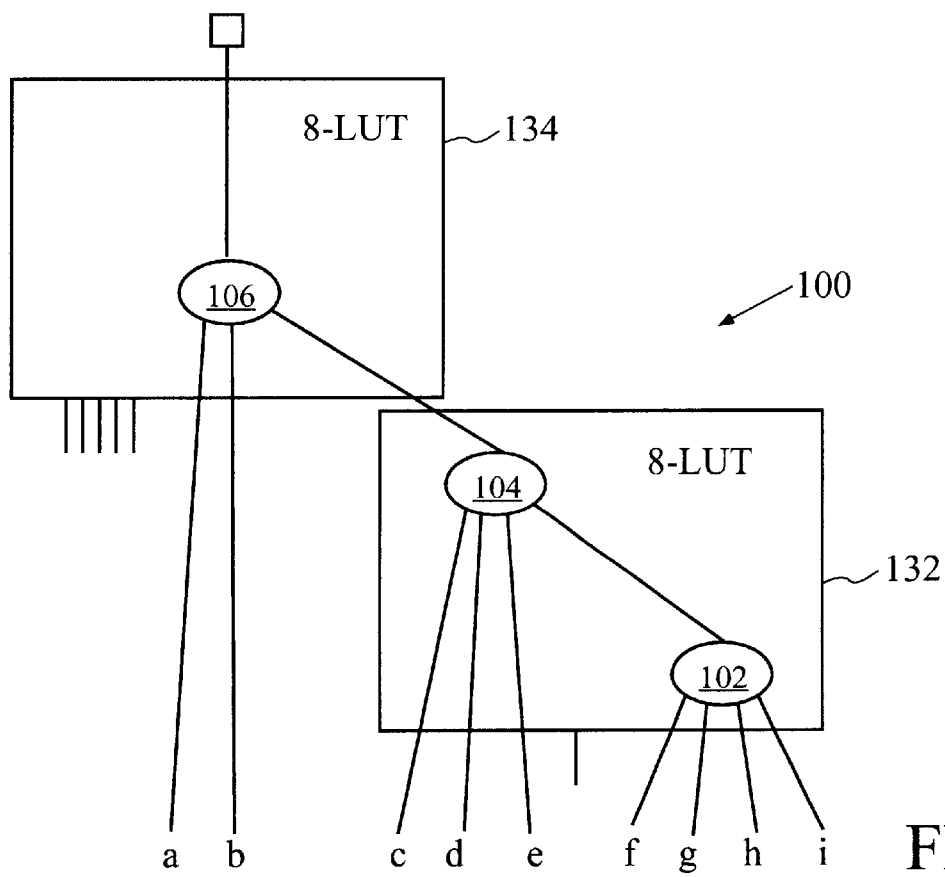
FIG. 3 is a graph of the network after mapping the nodes to two 8-LUTs.
Figure 4:
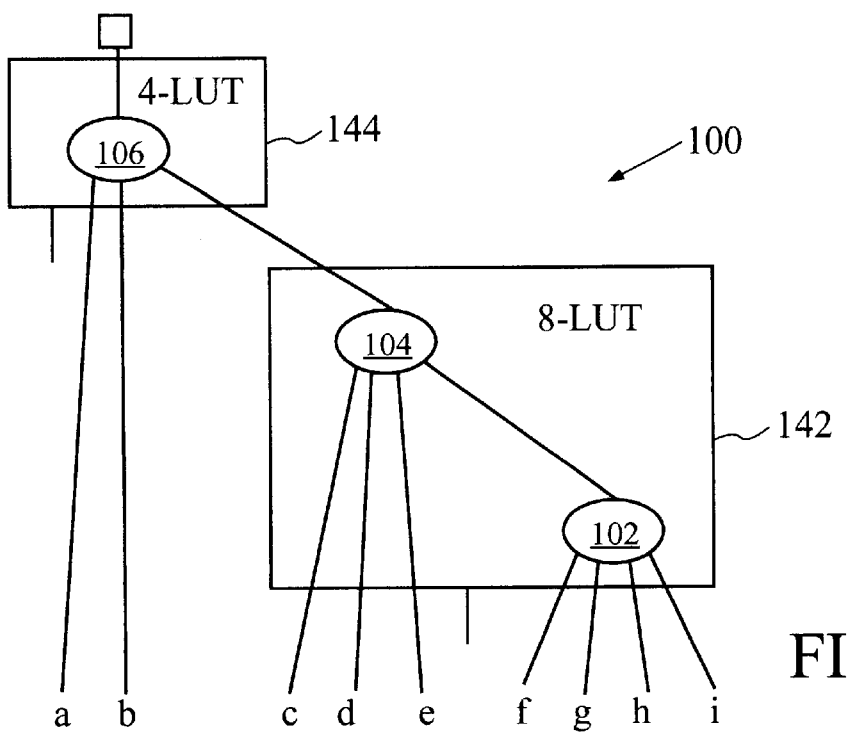
FIG. 4 is a graph of the network after mapping the nodes to an 8-LUT and a 4-LUT.

FIGS. 2, 3, and 4 illustrate various mappings of the network 100 to 4-LUTs and 8-LUTs, and the accompanying discussion explains how the respective mapping impacts the delay of the network 100. It is assumed in each mapping that primary inputs have a delay factor of 0, a 4-LUT has a delay factor of 3, and an 8-LUT has a delay factor of 5.

FIG. 2 is a graph of the network 100 after mapping the nodes 102, 104 and 106 to respective 4-LUTs 112, 114, and 116. The 4-LUT 112 receives the inputs f, g, h, and i and implements the function of node 102; the 4-LUT 114 receives the inputs c, d, e, and the output of the 4-LUT 112 and implements the function of node 104; and the 4-LUT 116 receives the inputs a, b, and the output of 4-LUT 114 and implements the function of node 106. Note that the input 118 to the 4-LUT 116 is available but unused since node 106 only has 3 inputs.

The combined delay factors of the 4-LUTs 112, 114, and 116 result in an overall delay of 9 for the network 100. Specifically, the overall delay is the sum of the delay factors of the 4-LUTs 112–116 (delay(LUT 112) plus delay(LUT 114) plus delay(LUT 116)=3+3+3=9).

FIG. 3 is a graph of the network 100 after mapping the nodes 102, 104 and 106 to two 8-LUTs 132 and 134. The 8-LUT 132 implements the functions of nodes 102 and 104 and receives the inputs c, d, e, f, g, h, and i; and the 8-LUT 134 implements the function of node 106 and receives the inputs a, b, and the output of the 8-LUT 132. As with the 4-LUT of 116 of FIG. 2, some inputs of the 8-LUT 132 and 134 are unused.

The overall delay of the network 100 when mapped to the two 8-LUTs 132 and 134 is the sum of the delay factors of the 8-LUTs. Thus, the overall delay is 10 (delay(LUT 132) plus delay(LUT 134)=5+5=10).

As compared to the mapping of FIG. 2, there is a difference of 1 unit between the overall delay of the 4-LUTs 112–116 and the overall delay of the 8-LUTs 132–134. Therefore, in terms of delay, the mapping of FIG. 2 is better than the mapping of FIG. 3. Moreover, it should be noted that the mapping of FIG. 3 includes 2 LUTs as compared to the 3 LUTs used in the mapping of FIG. 2. Therefore, the mapping of FIG. 3 may be more desirable from the standpoint of area usage, depending on the relative areas of 4-LUTs vs. 8-LUTs. (If an 8-LUT has 3 times the area of a 4-LUT, an 8-LUT mapping requires more area. However, if an 8-LUT has the same area as a 4-LUT, the new 8-LUT mapping is better.)

FIG. 4 is a graph of the network 100 after mapping the nodes 102, 104 and 106 to an 8-LUT 142 and a 4-LUT 144. The 8-LUT 142 implements the functions of nodes 102 and 104 and receives the inputs c, d, e, f, g, h, and i; and the 4-LUT implements the function of node 106 and receives the inputs a, b, and the output of the 8-LUT 142. The overall delay of the network 100 in the mapping of FIG. 4 is 8 (delay(LUT 142) plus delay(LUT 144)=5+3=8).

As compared to the mappings of FIGS. 2 and 3, the mapping of FIG. 4 provides an overall delay that is less than the delay of the mapping of FIG. 2 and less than the overall delay of the mapping of FIG. 3. In addition, the number of LUTs used in the mapping of FIG. 4 is 2, whereas the number of LUTs used in the mapping of FIG. 2 is 3. Thus, the mapping of FIG. 4 that uses LUTs of different sizes (a 4-LUT 144 and an 8-LUT 142) provides a mapping with both a reduced overall delay and a reduced number of LUTs as compared to the mappings in which only LUTs of a single size were used. However, depending on relative LUT sizes, the new mapping may require more or less area.

Figure 5:
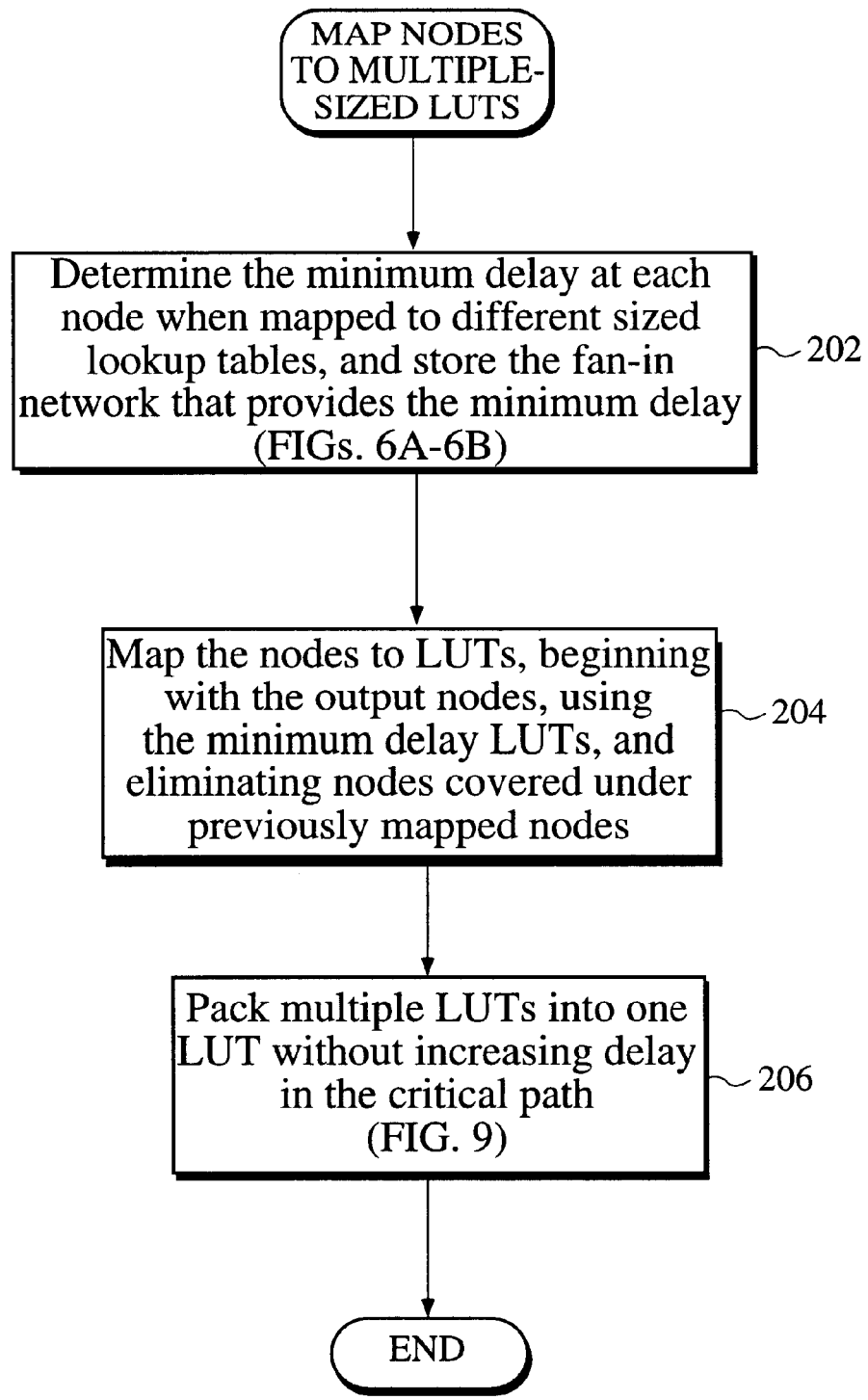
FIG. 5 is a flowchart of a process for mapping a network of nodes to LUTs having various sizes in accordance with an example embodiment of the invention.

FIG. 5 is a flowchart of a process for mapping a network of nodes to LUTs having various sizes in accordance with an example embodiment of the invention. The process generally proceeds in three phases, wherein phase 1 is illustrated by step 202, phase 2 is illustrated by step 204, and phase 3 is illustrated by step 206.

In phase 1, the nodes are processed in topological order, with all predecessor nodes to a node being processed before the node is processed. For each node, the minimal delay is determined using the different sizes of LUTs available (e.g., 4-LUT and 8-LUT). The LUTs that provide the minimal delays and the associated nodes are stored for processing in phase 2.

At the end of phase 1, the stored mapping includes for each node the identification of a node and its predecessor node(s) to be implemented with a LUT, the size of the LUT, and a delay factor (also referred to as the "label") that is associated with the LUT and the associated nodes.

In phase 2, the nodes that are respectively associated with the LUTS, as determined in phase 1, are mapped to specific LUTs for a particular programmable gate array. The mapping process begins with the output nodes, and each node is replaced with a LUT as specified in phase 1. In processing the nodes, a node is deleted if it does not fan out to another node that is outside the sub-network in process. The predecessor nodes that are combined with a node are also deleted. Phase 2 can be implemented with a known covering process, for example, the covering portion of the Flowmap process. A "cover" is the set of all nodes that are collapsed into the x-LUT associated with a node.

Phase 3 attempts to reduce the number of LUTs used in the mapping by packing multiple LUTs into a single LUT. Generally, the packing process will combine multiple LUTs into a single LUT if the overall delay in a critical path of the network is not increased.

Figure 6A:
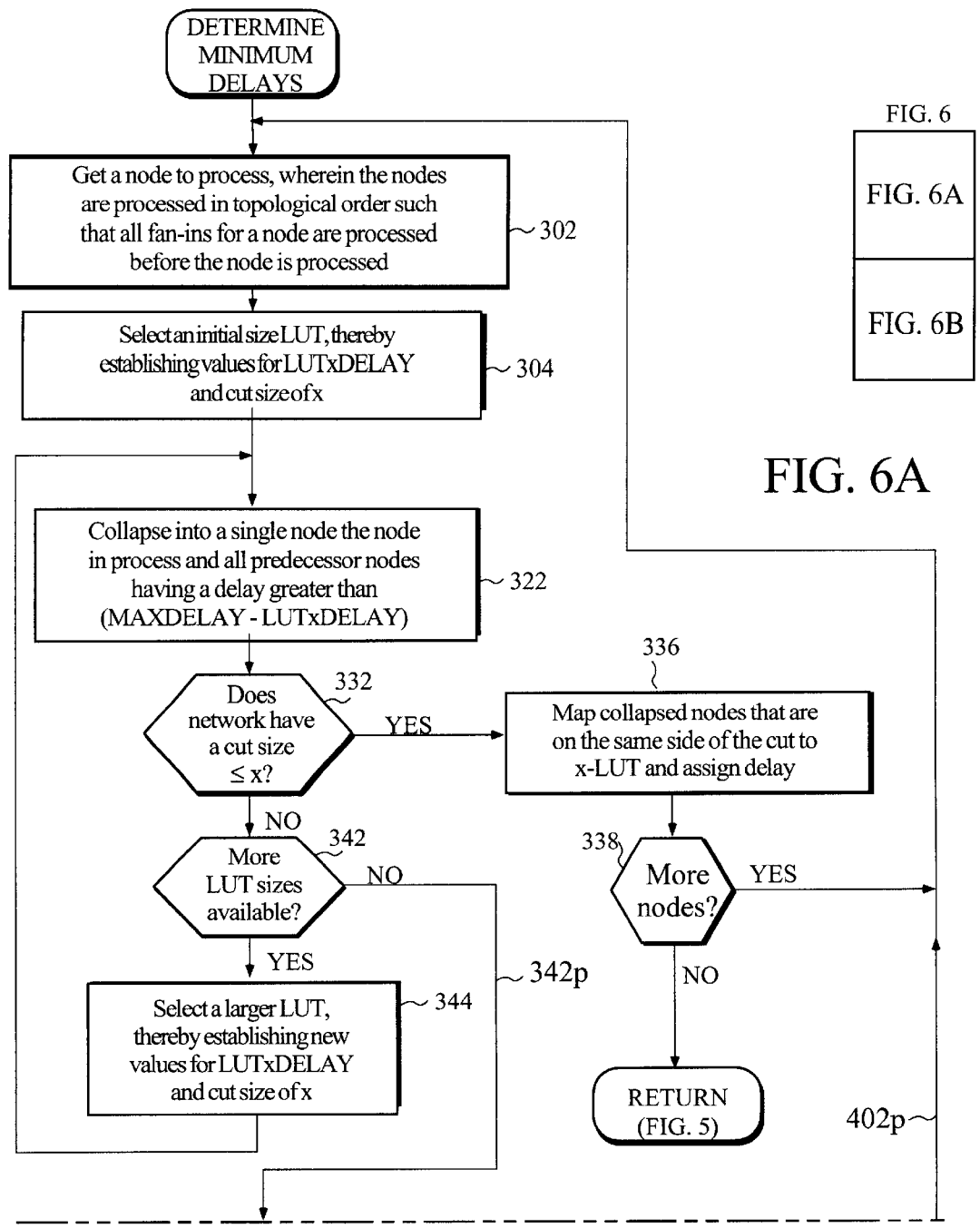
FIG. 6 (comprising FIGS. 6A and 6B) is a flowchart of an example process for determination of the minimum delays of nodes in a network as implemented with various sizes of LUTS.
Figure 6B:
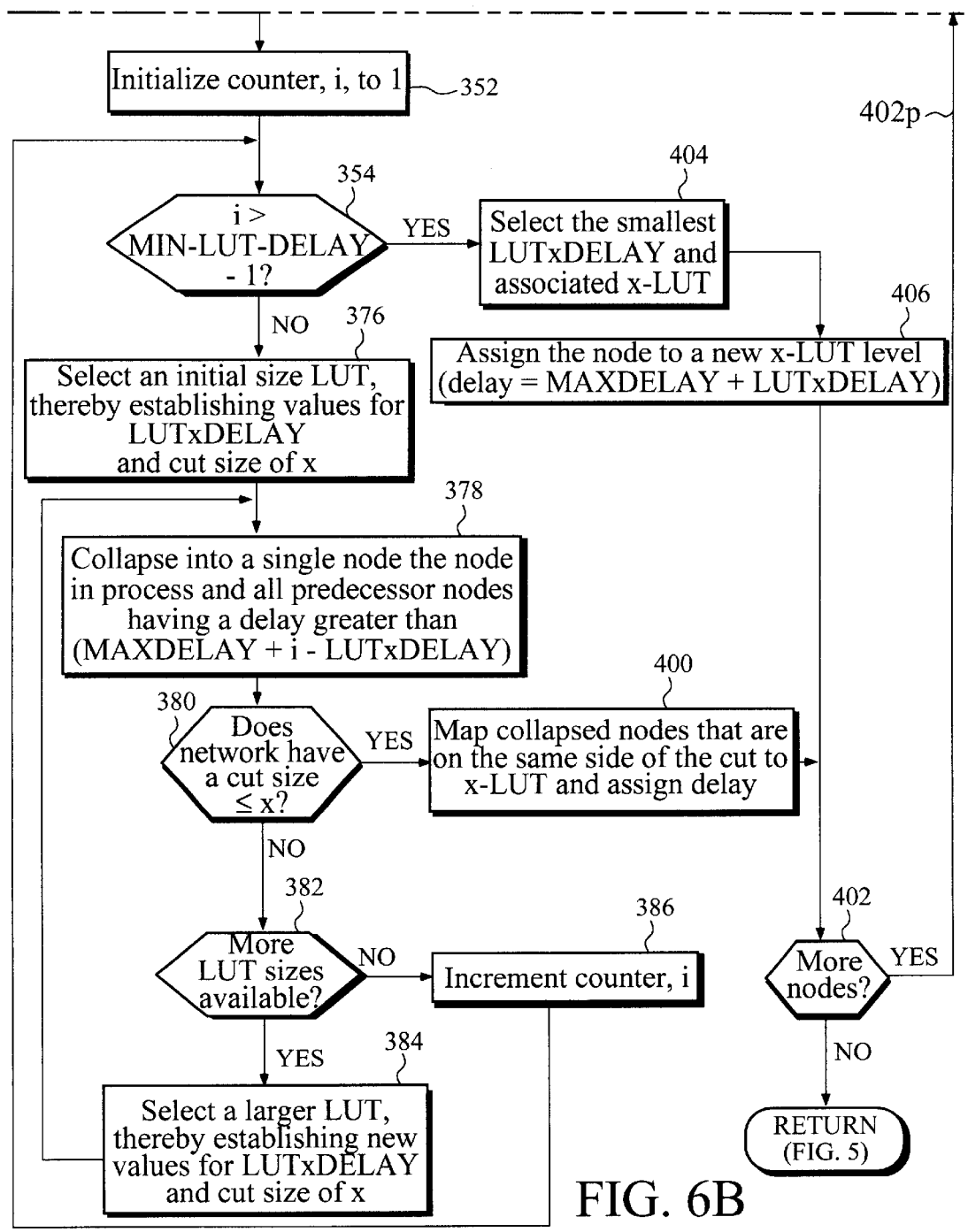

FIG. 6 (comprising FIGS. 6A and 6B) is a flowchart of an example process for determining the minimum delays of nodes in a network as implemented with various sizes of LUTs. The objective of the process for determining the minimum delays of the nodes in the network is to find the smallest possible delay of a given node in the network when the node and its predecessor nodes are mapped to the various sizes of LUTs. In processing a particular node, the minimum delay process generally first checks whether the delay factor of the node when combined with selected ones of its predecessor nodes, or "fan-ins," can be the same as the maximum delay of its fan-ins. If the node cannot be combined as indicated, the process then checks whether the node when combined with selected ones of its fan-ins can be the same as the maximum delay of its fan-ins plus a selected value. If the second combination is not possible, a LUT size is selected based on the size that has the minimum delay factor.

The process of FIG. 6 is described in conjunction with the example graphs of FIGS. 7A–7B and 8A–8E. The graphs illustrate example networks as various steps of the process are performed on the networks.

At step 302 of FIG. 6, the process begins by getting a node to process. According to the example embodiment, the nodes are processed in topological order with all fan-ins to a node being processed before a node is processed. At step 304, an initial size of LUT is then selected based on the sizes available for the selected programmable gate array architecture. In the example embodiment, the smallest LUT is selected first, assuming that the smallest LUT has the smallest delay.

Figure 7A:
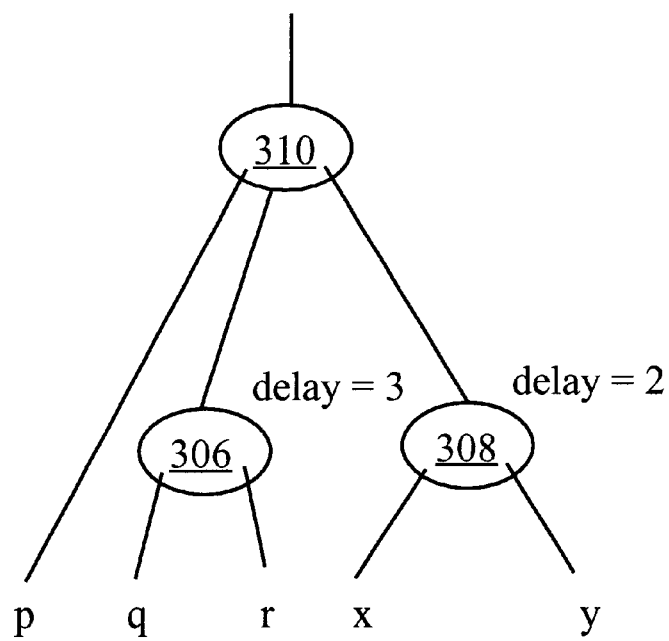
FIG. 7A is a graph of an example network having a plurality of logic nodes.

FIG. 7A is a graph of an example network having nodes 306, 308, and 310. The inputs p, q, r, x, and y are primary inputs, and therefore, are assumed to have a delay factor of 0. The example delay factors associated with nodes 306 and 308 are 3 and 2, respectively. It will be appreciated that the delay factors were chosen for the purpose of illustrating the process steps of FIG. 6. Because delay factors have been associated with nodes 306 and 308, it can be seen that node 310 can be processed, since its fan-ins have been processed. Thus, node 310 is the node selected at step 302.

If, for example, a programmable gate array architecture has available 4-LUTs and 8-LUTs, step 304 first selects a 4-LUT when processing a node. For the example of FIGS. 7A & 7B, 4-LUTs are assumed to have a delay factor of 2, and 8-LUTs are assumed to have a delay factor of 3.

At step 322, node 310 and its fan-ins having a delay factor that is greater than MAXDELAY minus LUTxDELAY are collapsed into a single node. MAXDELAY is the maximum delay factor of the fan-ins to the node in process, in this example, 3. The LUTXDELAY is the delay associated with the size of the LUT selected at step 304. Thus, LUTxDELAY=2 since a 4-LUT was initially selected.

Figure 7B:
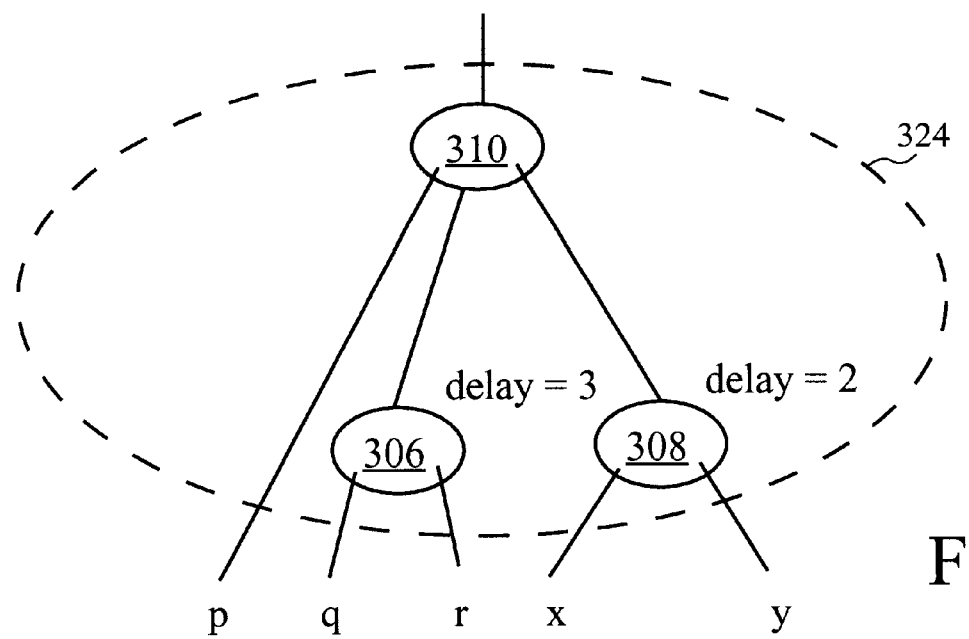
FIG. 7B illustrates a plurality of nodes collapsed into a single node.

The dashed oval 324 of FIG. 7B illustrates that nodes 306, 308, and 310 have been collapsed into a single node. For example, node 308 is collapsed into this single node because its delay factor (2) is greater than MAXDELAY minus LUTxDELAY (3−2=1). It will be appreciated that predecessor nodes that are more than one level removed from the node in process can be collapsed (in another example network having more than two levels), even though the example network has only two levels of nodes.

Decision step 332 tests whether the collapsed network of nodes has a cut-size that is less than or equal to the number of inputs to the LUT. That is, can the collapsed network of nodes be divided to include node 310 and one or more of its predecessors, wherein the node and the one or more of the predecessors can be implemented with an LUT of the selected size (e.g., 4-LUT). Conventional processes for determining the cut-size are known.

After collapsing, the network consists of a single node that subsumes nodes 306–310, as indicated by dashed oval 324. Node 324 has 5 inputs, p, q, r, x, and y. The network of FIG. 7B does not have a cut-size less than or equal to 4, so step 332 directs the process to step 342 to test whether there are more sizes of LUTs available. If so, step 344 selects the next larger LUT. For example, if an 8-LUT is the next available size of LUT, the new LUTXDELAY would be 3, and the cut-size to consider is 8. Control is then returned to step 322. Continuing with the example of FIG. 7B, again nodes 306–310 are collapsed into the single node 324 since all the nodes have delays > MAXDELAY minus LUTxDELAY (3−3=0). The network has a cut-size of 8, therefore step 332 directs the process to step 336 where, for example, collapsed nodes 306–310 are mapped to the 8-LUT.

If there are more nodes to process, step 338 returns control to step 302 to get another node. Otherwise, control is returned to step 202 of FIG. 5.

Steps 304–344 generally combine a node and selected ones of its predecessors into a single LUT (of a selected size) if the node can have the same delay as the maximum delay of its fan-ins. If this is not possible, step 342 directs the process to step 352 to begin the process of checking whether the node can be combined with selected ones of its predecessors into a single LUT (of a selected size) with a delay factor that is equal to the maximum delay of its predecessors plus a selected value.

Figure 8A:
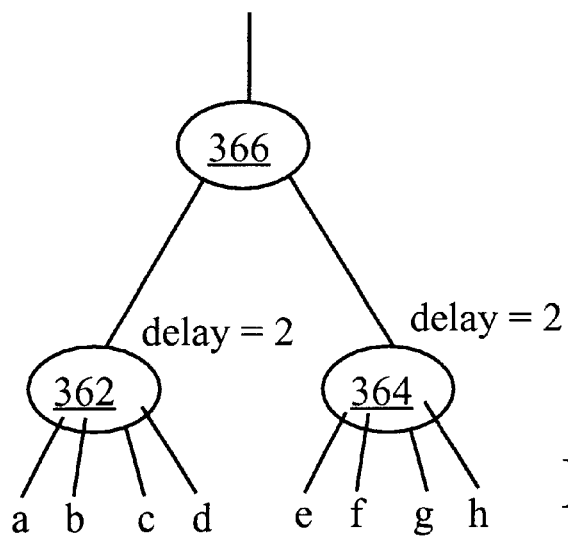
FIG. 8A is a graph of an example network of logic nodes.

Step 352 initializes a counter that is used as the selected value by which the maximum delay of a node's predecessors is increased. Turning now to FIG. 8A, an example network of nodes is depicted in a graph. The network of FIG. 8A is used to illustrate the process of checking whether the node can be combined with selected ones of its predecessors into a single LUT (of a selected size) with a delay factor that is equal to the maximum delay of its predecessors plus a selected value. The network includes nodes 362, 364, and 366, where both nodes 362 and 364 have delay factors of 2. The inputs are all assumed to be primary inputs having delays of 0, wherein inputs a, b, c, and d are input to node 362, and inputs e, f, g, and h are input to node 364. As with the previous example, the programmable gate array architecture is assumed to have 2 sizes of LUTs, a 4-LUT with a delay factor of 2 and an 8-LUT with a delay factor of 3. Relative to the process of FIG. 6, node 366 is the node in process.

Figure 8B:
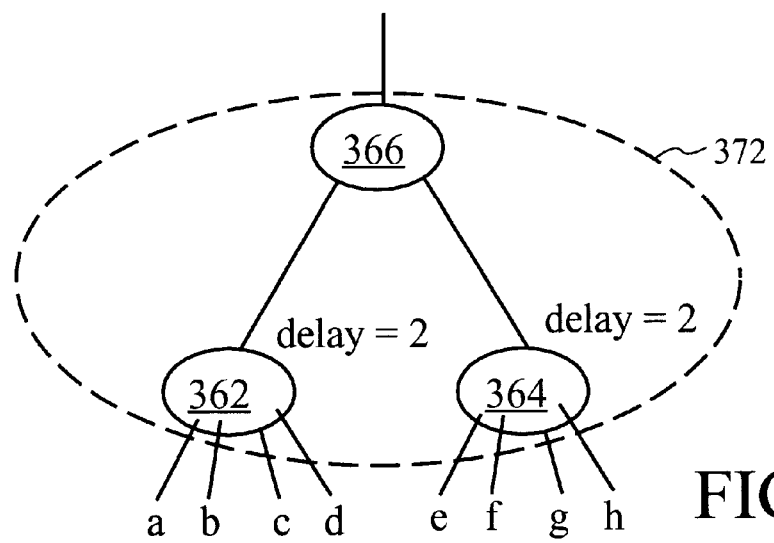
FIG. 8B illustrates how a node of FIG. 8A cannot be combined with its predecessor nodes to form a node having a delay that is equal to the maximum delay of its fan-ins.
Figure 8C:
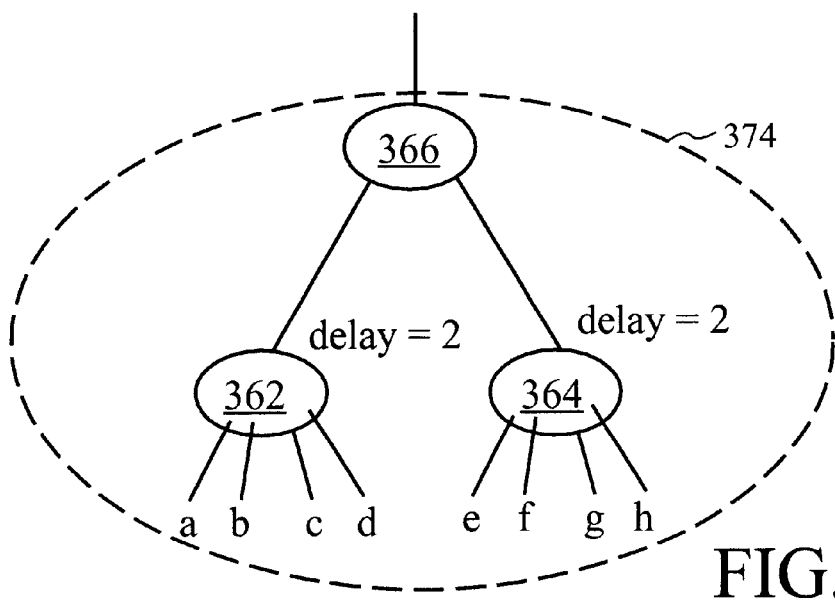
FIG. 8C is a graph that illustrates the process of FIG. 6.

FIGS. 8B and 8C illustrate how node 366 cannot be combined with its predecessor nodes to form a node having a delay that is equal to the maximum delay of its fan-ins. FIG. 8B illustrates an iteration through steps 304, 322, and 332 using a 4-LUT. First, dashed oval 372 illustrates that collapsed node 366 and its predecessors can be collapsed into a single node, but the cut-size indicated by the oval 372 is greater than 4.

FIG. 8C illustrates an iteration through steps 304, 322, and 332 using an 8-LUT. Dashed oval 374 illustrates that not only are nodes 362 and 364 collapsed with node 366, but the primary inputs a, b, c, d, e, f, g, and h are collapsed as well. The primary inputs are collapsed because their associated delays (0) are greater than the maximum delay of the predecessor nodes minus the 8-LUT delay (2−3=−1). Generally, where MAXDELAY minus LUTXDELAY is negative, no cuts are possible because the entire network would be collapsed into a single node. Thus, for the example of FIGS. 8A–8C, the process of FIG. 6 proceeds to steps 352 and 354.

Figure 8D:
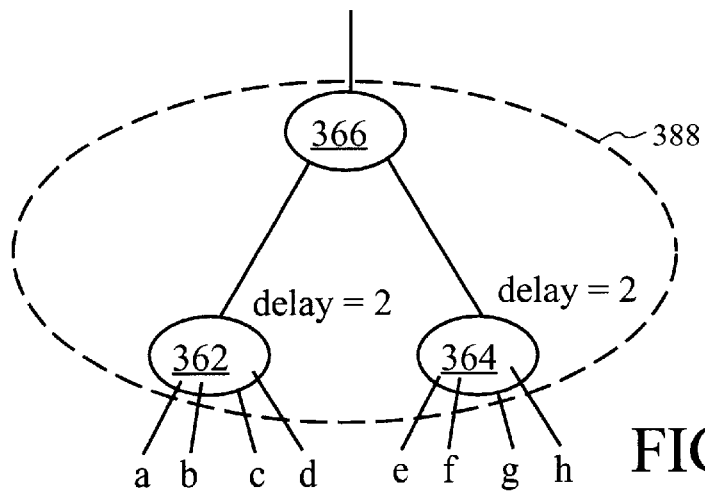
FIG. 8D is a graph that further illustrates the process of FIG. 6.
Figure 8E:
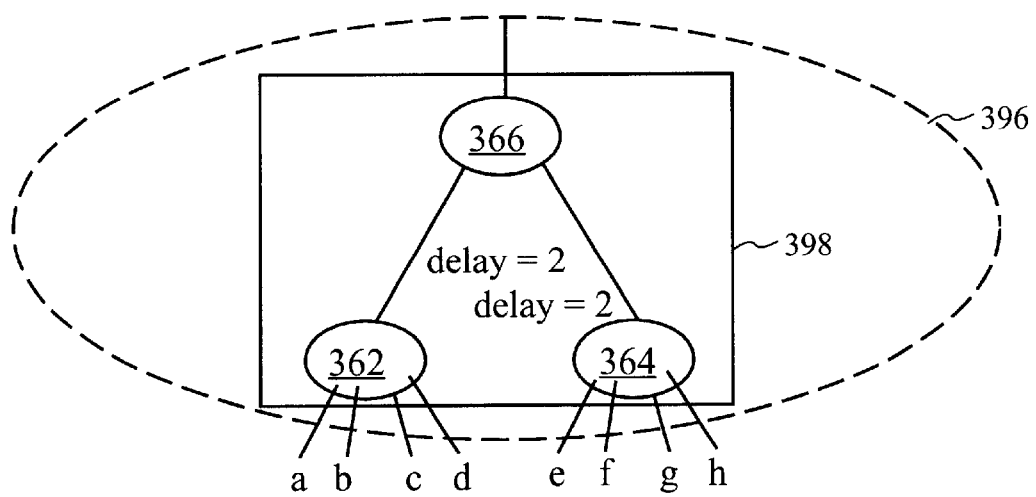
FIG. 8E is a graph that further illustrates the process of FIG. 6.

Step 354 first tests whether the value in counter i is greater than MIN-LUT-DELAY minus 1, where MIN-LUT-DELAY is the delay of the fastest LUT. In the example embodiment, process steps 376–386 are repeated until a cut is found or the counter value reaches MIN-LUT-DELAY. FIGS. 8D and 8E contain graphs that further illustrate the process steps of FIG. 6 using the example of FIGS. 8A through 8C. Step 376 selects an initial size of LUT based on the sizes available for the selected programmable gate array architecture. In the example embodiment, if the smallest LUT has the smallest delay, the smallest LUT is selected first.

Beginning with a 4-LUT, dashed oval 388 illustrates that predecessor nodes 362 and 364 can be collapsed with node 366. Specifically with reference to step 378, the delay factors of nodes 362 and 364 (2) are both greater than MAXDELAY plus i minus 4-LUT delay (2+1−2=1). However, decision step 380 finds and FIG. 8D illustrates that collapsed network 388 does not have a cut-size of 4. Step 380 directs the process to step 382 to check whether there are more LUT sizes available. If there are more LUT sizes available, the process is directed to step 384 to select the next larger LUT. If the next larger LUT is an 8-LUT, step 384 selects an 8-LUT and the process returns to step 378.

As shown by dashed oval 396 of FIG. 8D, nodes 362 and 364 can be collapsed with node 366 where the delay factors of nodes 362 and 364 (2) are both greater than MAXDELAY plus i minus 8-LUT delay (2+1−3=0). Note that the primary inputs a-h have delay factors (0) that are not greater than MAXDELAY plus i minus 8-LUT delay and are therefore not collapsed with the node 366. Block 398 illustrates that the collapsed network 396 has a cut-size of 8, and finding this, step 380 directs the process to step 400 of FIG. 6. Step 400 associates collapsed nodes 362–366 with an 8-LUT, for example, and assigns a delay factor of 3 (i.e., the delay factor of the 8-LUT) to the collapsed set of nodes 396.

Decision step 402 tests whether there are more nodes to process and returns control to step 302 of FIG. 6 if there are more nodes. Otherwise, control is returned to step 202 of FIG. 5.

If decision step 382 finds that all the sizes of LUTs have been processed for the present value of the counter i, the counter is incremented at step 386 and control is returned to Step 354.

If a node cannot be combined with selected ones of its fan-ins such that the combination is either MAXDELAY (steps 322 and 332) or MAXDELAY plus i (steps 378 and 380), then step 354 directs the process to step 404 for a default selection of a size of LUT. Step 404 selects a LUT size having the smallest delay. For example, a 4-LUT having a delay of 2 would be selected over an 8-LUT having a delay of 3. Step 406 assigns the selected LUT size to the node in process and associates a delay factor with the node. The delay factor is MAXDELAY plus the delay of the selected LUT size. The process then continues with step 402 as described above.

Figure 9:
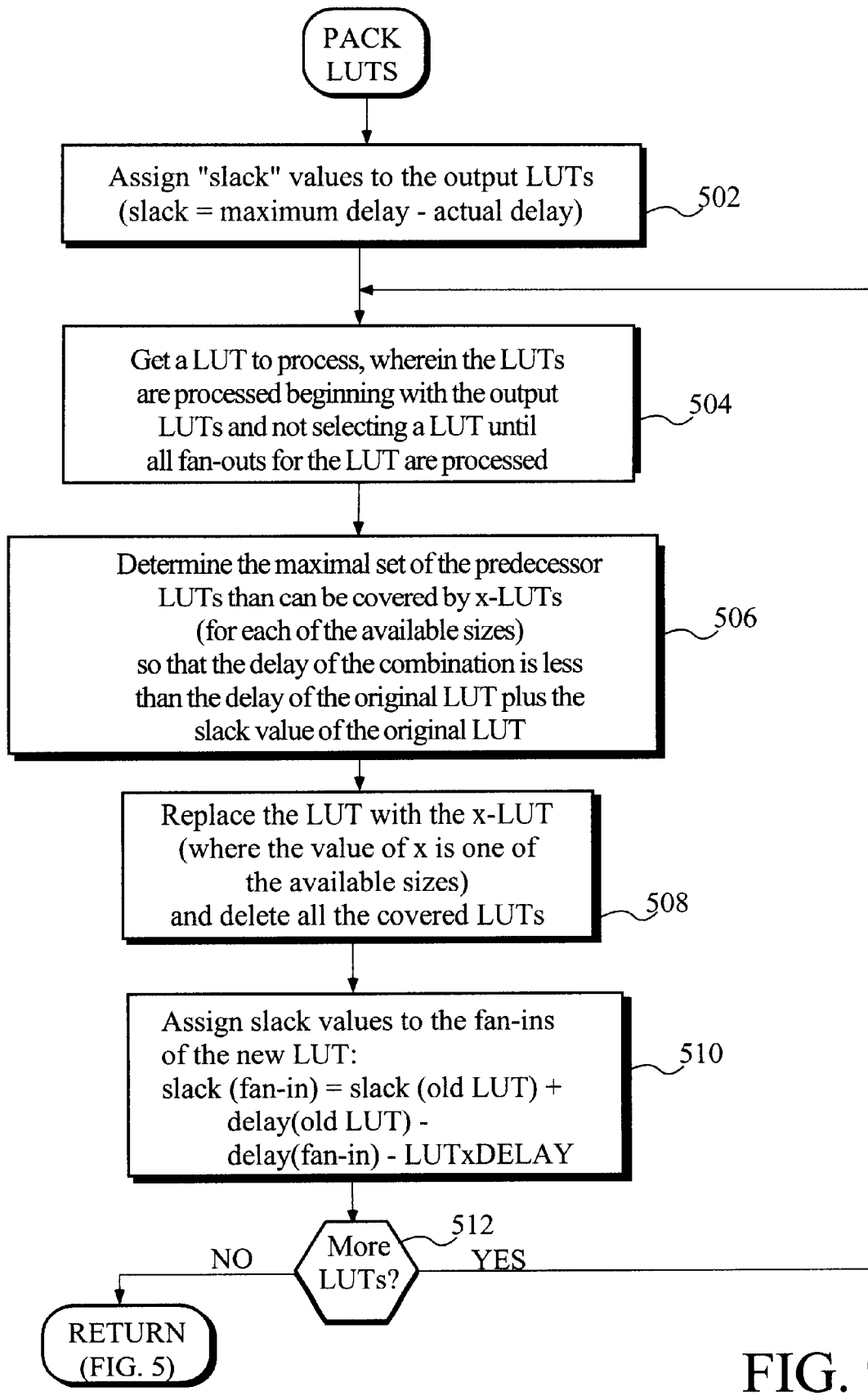
FIG. 9 is a flowchart of an example process for packing LUT mappings.

FIG. 9 is a flowchart of a process for packing the LUT mappings established in steps 202 and 204 of FIG. 5 into fewer LUTS, in accordance with an example embodiment of the invention. The process generally begins with those output LUTs that have no fan-outs. With other LUTs, before any particular LUT is processed, the fan-outs for the LUT are processed first. Generally, if the delay value of the combination does not exceed the delay of a selected critical path, a LUT and its predecessor LUTs are combined. A concept that underlies the process is that LUTs that are not on the critical path are not required to have the smallest possible delay. Thus, instead of minimizing the delay at these non-critical LUTS, the process packs as many predecessors as possible into a single LUT without increasing the critical path delay beyond its limit.

The critical limit is determined by the "slack" value. Initially, each output LUT is assigned a slack value that is equal to the difference between the maximum allowed delay at any of the output LUTs and the actual delay of the respective output LUT, as shown by step 502.

Each LUT in the network is processed in the order described above. Step 504 gets the first LUT to process. For the sizes of LUTs available for a programmable gate array, step 506 determines the maximal set of LUTs that can be covered by an x-LUT. For example, if a LUT A has predecessor LUTs B, C, D, and E, and there are 4-LUTs and 8-LUTs available, step 506 determines which and how many of LUTs A through E can be combined into a 4-LUT, determines which and how many of LUTs A through E can be combined into an 8-LUT, determines the respective delays of the combinations, and selects the set having the most predecessor LUTs and having a delay that is less than the delay of LUT A plus the slack value. It will be appreciated that the delay of a combination of LUTs is the maximum delay of the predecessor LUTs plus the delay of the LUT into which the LUTs are packed. In one embodiment, area is considered as well. Selection of the implementation to be used may be based on the total area of the predecessor LUTs or on a more complex function of LUT count, area, and delay.

Step 508 replaces the LUT with the x-LUT selected at step 506, and all the predecessor LUTs covered by the x-LUT are deleted, except that a LUT is not deleted if it is a fan-in for another LUT. Step 510 assigns new slack values from the predecessor LUTs to the new x-LUT. A new slack value for a fan-in LUT F of a new x-LUT A', where x-LUT A' is comprised of a LUT A that had fan-ins LUT B and LUT C, is computed as:

$$\text{slack}(LUT\ F) = \text{slack}(LUT\ A) + \text{delay}(LUT\ A) - \text{delay}(LUT\ F) - LUTXDELAY.$$

The process continues as long as there are more LUTS, as shown by decision step 512.

At the end of the packing process, the delay of the critical path remains unchanged (since the critical path has a slack of zero). However, LUTs on non-critical paths may have been re-mapped to LUTs of different sizes, packed with predecessor or successor LUTs, and assigned larger delays, wherein no path is made to have a delay that exceeds the delay of the critical path. The packing process is expected to result in a network having fewer LUTs and a smaller area. However, there may be some duplication of LUTs caused by fanout of the packed LUTs.

Figure 10:
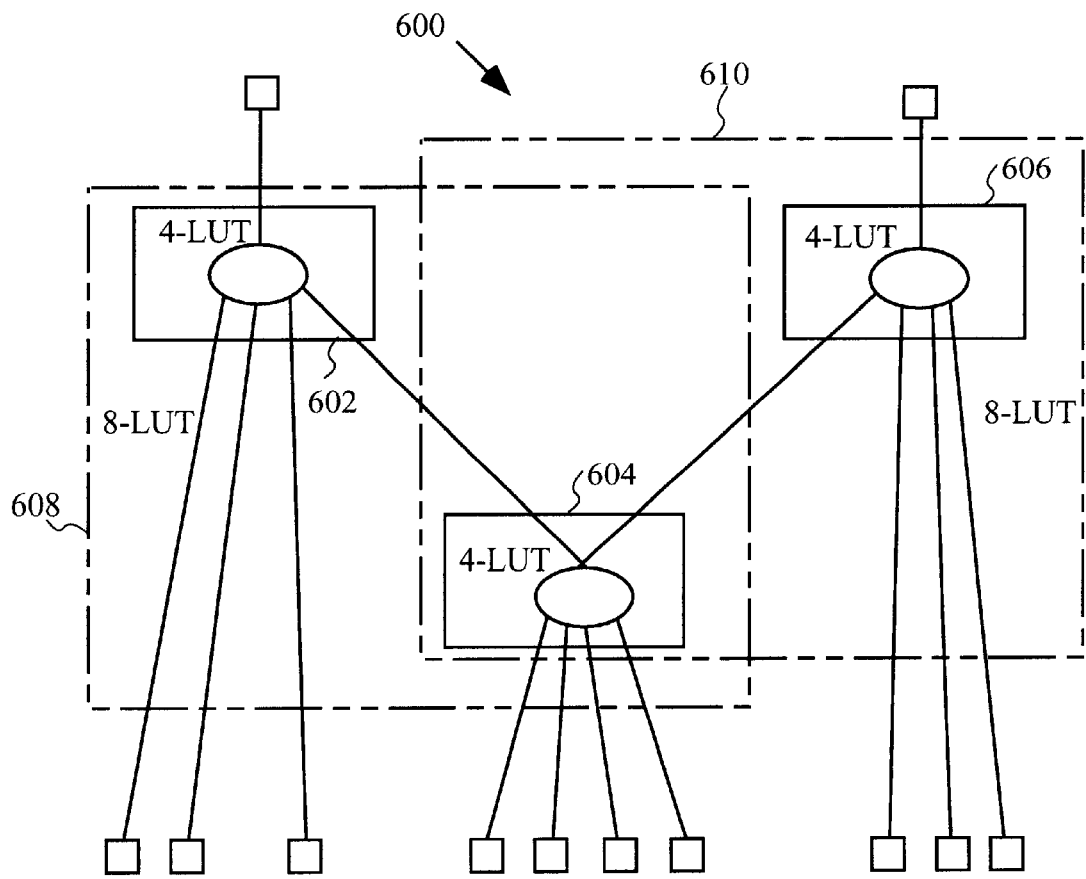
FIG. 10 is a graph of an example network, initially mapped to 4-LUTs, and subsequently packed into 8-LUTs.

FIG. 10 is a graph of an example network 600 initially mapped to 4-LUTs 602, 604, and 606. In the example, the 4-LUTs 602 and 604 are packed into an 8-LUT 608, and the 4-LUTs 604 and 606 are mapped into the 8-LUT 610. Note that during the packing process of FIG. 9, the 4-LUT 604 is not deleted until it has been assigned to both of 8-LUTs 608 and 610. A node is deleted only when it has no fanouts left. When a node fans out to more than one place, it may be present in the "cover" of more than one node. A "cover" is the set of all nodes that are collapsed into the x-LUT associated with a node, for example during the labeling phase 336 of FIG. 6A or 400 of FIG. 6B. When the cover of a node is assigned to a LUT, all the nodes in the cover that fan out only to other nodes in the cover are deleted.

Accordingly, the present invention provides, among other aspects, a method for mapping combinational logic to multiple sizes of LUTs in programmable logic devices. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A process for mapping logic nodes to a plurality of sizes of lookup tables in a programmable gate array, comprising:

selectively collapsing into a first single node, a node and its predecessor nodes as a function of delay factors associated with the plurality of sizes of lookup tables and a maximum of delay factors associated with the predecessor nodes;

selecting one of the sizes of lookup tables to implement the first single node if an associated cut-size of the first single node is less than or equal to the number of inputs to the one size;

selectively collapsing into a second single node a node and its predecessor nodes as a function of the delay factors and the maximum delay factor increased by a selected value if a lookup table size was not selected for the first single node; and selecting one of the sizes of lookup tables to implement the second single node if an associated cut-size of the second single node is less than or equal to the number of inputs to the one size.

2. The process of claim 1, further comprising selecting a predetermined size of lookup table as a default size to implement the node if a size was not selected for either the first or second single nodes.

3. The process of claim 1, further comprising:

if a size was selected for the first single node, assigning a delay factor to the first single node;

if a size was selected for the second single node, assigning a delay factor to the second single node;

repeating the steps of selectively collapsing and selecting sizes for all the nodes in a network.

4. The process of claim 3, wherein the delay factor assigned to the first single node is the maximum of delay factors associated with the predecessor nodes, and the delay factor assigned to the second single node is the maximum of delay factors associated with the predecessor nodes plus the selected value.

5. The process of claim 3, further comprising mapping the nodes in an order such that all predecessors of a node are mapped before the node is mapped.

6. The process of claim 5, further comprising replacing the nodes with lookup tables having the sizes from the selecting steps.

7. The process of claim 6, wherein replacing begins with output nodes and proceeds in an order such that all nodes receiving an input from a node are processed before the node.

8. The process of claim 6, further comprising combining groups of selected ones of the lookup tables into respective single lookup tables using the plurality of sizes of lookup tables.

9. The process of claim 8, further comprising:

determining a maximum path delay value of delay values associated with respective input/output paths through the programmable gate array; and combining a group of selected ones of the lookup tables into a single lookup table only if the path delay value associated with the single lookup table does not exceed the maximum path delay value.

10. A process for mapping a logic node and its predecessor logic nodes to one of a plurality of sizes of lookup tables in a programmable gate array, each of the plurality of sizes of lookup tables having an associated delay factor, comprising:

(a) initializing a counter to a selected value;

(b) selecting one of the sizes of lookup tables;

(c) collapsing into a single node the logic node and the ones of the predecessor logic nodes having delay factors greater than a maximum of delay factors associated with the predecessor logic nodes plus the counter value minus the delay factor of the one size lookup table;

(d) if the single node has an associated cut-size that is less than or equal to the number of inputs to the one size lookup table, mapping to the one size lookup table the logic nodes that have been collapsed into the single node and that are within a cut of the single node;

(e) if the associated cut-size of the single node is greater than the number of inputs of the one size lookup table, selecting another one of the sizes of lookup tables to use as the one size;

(f) repeating steps (c) through (e) until the logic nodes within a cut are mapped or cut-sizes for all the sizes of lookup tables have been considered in mapping;

(g) if the logic nodes within a cut have not been mapped to one of the sizes of lookup tables and cut-sizes for all the sizes of lookup tables have been considered in mapping, incrementing the counter value; and (h) repeating steps (b) through (g) until the counter value equals a least of delay factors of the sizes of lookup tables.

11. The process of claim 10, wherein the sizes are selected in order from the lookup table having the least delay factor to the lookup table having the greatest delay factor.

12. A process for mapping a logic node and its predecessor logic nodes to one of a plurality of sizes of lookup tables in a programmable gate array, each of the plurality of sizes of lookup tables having an associated delay factor, comprising:

(a) initializing a collapse factor as a function of a maximum of respective delay factors associated with the predecessor logic nodes, wherein the collapse factor is greater than the maximum of the delay factors of the predecessor logic nodes;

(b) selecting one of the sizes of lookup tables;

(c) collapsing into a single node the logic node and the ones of the predecessor logic nodes having delay factors greater than the collapse factor minus the delay factor of the one size lookup table;

(d) if the single node has an associated cut-size that is less than or equal to the number of inputs to the one size lookup table, mapping to the one size lookup table the logic nodes collapsed into the single node that are within a cut of the single node;

(e) if the associated cut-size of the single node is greater than the number of inputs of the one size lookup table, selecting another one of the sizes of lookup tables to use as the one size;

(f) repeating steps (c) through (e) until the logic nodes within a cut are mapped or all the sizes of lookup tables have been considered in mapping.

13. The process of claim 12, further comprising:

(g) if the logic nodes within a cut have not been mapped to one of the sizes of lookup tables and cut-sizes for all the sizes of lookup tables have been considered in mapping, increasing the collapse factor; and (h) repeating steps (b) through (g) until the logic nodes within a cut are mapped or the collapse factor exceeds a predetermined value.

14. The process of claim 13, wherein the sizes are selected in order from the lookup table having a least delay factor to the lookup table having the greatest delay factor.

15. The process of claim 13, wherein the predetermined value is a least of the delay factors of the sizes of lookup tables.

16. A process for mapping logic nodes comprising:
   (a) arranging the nodes to be processed in topological order such that all fan-ins for a node are processed before the node is processed;
   (b) getting the next node to be processed;
   (c) selecting the smallest size LUT;
   (d) collapsing into a single node the node in process and all predecessor nodes having a delay greater than the maximum delay of the predecessor nodes minus the LUT delay of the selected LUT;
   (e) if the network formed by collapsing these nodes has a cut size no greater than that of the selected LUT, mapping the collapsed node into the selected LUT and assigning the LUT delay to the collapsed node;
   (f) if the cut sizes don't match and there are more LUT sizes available, selecting a larger LUT size;
   (g) repeating steps d, e, and f until all LUT sizes have been tried or the node is mapped;
   (h) if mapping did not occur for any LUT size when all those predecessor nodes having delay greater than the maximum delay of the predecessor nodes minus the LUT delay of the selected LUT were collapsed into a single node, then increasing delay by a factor i and repeat steps c through g until the factor i is equal to delay of the fastest LUT;
   (i) selecting a fastest LUT and assigning the node to the fastest LUT; and
   (j) repeating the process for all nodes.

17. The process of claim 16, wherein a smaller lookup table is faster than a larger lookup table.

18. The process of claim 16, wherein the factor i is a least of the delay factors of the sizes of LUTs.

19. A process for using slack information to determine LUT output delay, wherein the LUT output delay is the time interval between when a signal arrives at a primary input to the time when the signal arrives at the output of the LUT, comprising:
   (a) arranging LUTs to be processed in topological order such that all fan-outs from an original LUT are processed before the original LUT is processed; and
   (b) for each original LUT:
      (b1) determining the maximum set of predecessor original LUTs that can be covered by a new LUT such that the LUT output delay of the new LUT is less than or equal to the LUT output delay of the original LUT plus the slack value of the original LUT;
      (b2) replacing the original LUT and the maximum set of predecessor original LUTs with the new LUT; and
      (b3) assigning slack values to fan-ins of the new LUT.

* * * * *